(12) United States Patent
Schindler

(10) Patent No.: US 6,185,815 B1
(45) Date of Patent: *Feb. 13, 2001

(54) SEMICONDUCTOR MOUNTING APPARATUS WITH A CHIP GRIPPER TRAVELLING BACK AND FORTH

(75) Inventor: Samuel Schindler, Horgen (CH)

(73) Assignee: Esec SA, Cham (CH)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/205,001

(22) Filed: Dec. 2, 1998

(30) Foreign Application Priority Data

Dec. 7, 1997 (CH) .................................................. 2807/97

(51) Int. Cl.[7] .................................................. H05K 3/30
(52) U.S. Cl. .............................. 29/740; 29/739; 29/741; 198/468.4
(58) Field of Search ........................... 29/739, 740, 741; 198/468.4, 468.2; 414/752, 753, 751, 225, 226, 744.6

(56) References Cited

U.S. PATENT DOCUMENTS

| Re. 34,615 | 5/1994 | Freeman | 348/95 |
|---|---|---|---|
| 3,337,941 | 8/1967 | Drop | 29/203 |
| 4,144,449 | 3/1979 | Funk et al. | 250/221 |

(List continued on next page.)

FOREIGN PATENT DOCUMENTS

| 28 34 836 | 8/1978 | (DE) | H05K/13/00 |
|---|---|---|---|
| 29 39 102 | 9/1979 | (DE) | B05C/1/08 |
| 34 24 323 A1 | 7/1984 | (DE) | H05K/13/02 |
| 35 44 221 A1 | 12/1985 | (DE) | H05K/13/04 |
| 37 36 563 A1 | 10/1987 | (DE) | H05K/13/02 |
| 41 27 696 A1 | 8/1991 | (DE) | H05K/13/02 |
| 0 236 225 | 9/1987 | (EP) | H05K/13/02 |
| 0 340 100 | 11/1989 | (EP) | G06K/19/06 |
| 0 462 596 A1 | 12/1991 | (EP) | H01L/21/00 |
| 0 476 577 A2 | 3/1992 | (EP) | H05K/13/00 |
| 0 647 943 A1 | 4/1995 | (EP) | G11C/5/00 |
| 0 649 719 A1 | 4/1995 | (EP) | B29C/45/14 |
| 0 682 321 A2 | 11/1995 | (EP) | G06K/19/077 |
| 0 778 610 | 11/1997 | (EP) | H01L/21/00 |
| 2 548 852 | 7/1983 | (FR) | H04N/7/00 |
| 2 548 857 | 7/1983 | (FR) | H05K/3/00 |
| 2 111 863 | 12/1981 | (GB) | B05B/13/00 |
| 2 183 820 | 6/1987 | (GB) | G05D/3/10 |
| 2-303751 | 12/1990 | (JP) | B23Q/15/22 |

(List continued on next page.)

OTHER PUBLICATIONS

Marked–Up Copy of Stannek (US 4,819,326) Apr. 11, 1989.*

Primary Examiner—Icuda Rosenbaum
Assistant Examiner—Rick Kiltae Chang
(74) Attorney, Agent, or Firm—Thelen, Reid & Priest, LLP; David B. Ritchie

(57) ABSTRACT

A "pick-and-place" apparatus has a first pivoted lever driven in alternating directions of pivoting, the drive shaft of which is mounted centrally between a first location and a second location. In the end positions, which delimit the pivoting range, the pivoted lever always faces towards one location or the other location. A second pivoted lever is mounted at the end of the first lever and driven in the opposite direction thereto and with a predetermined gear ratio thereto, for example, resulting from a fixed toothed wheel by means of a toothed belt and a further toothed wheel. The chip gripper is connected to the end of the second lever. The gear ratio and the lengths of the two levers are matched to each other such that in both end positions, the two levers are in an extended position with respect to one another and the chip gripper is over the one location or the other location. The pivot planes of the levers can be perpendicular or parallel to the planes of the chip carrier and/or of the substrate upon which the chips are mounted.

28 Claims, 4 Drawing Sheets

U.S. PATENT DOCUMENTS

Figure 1:
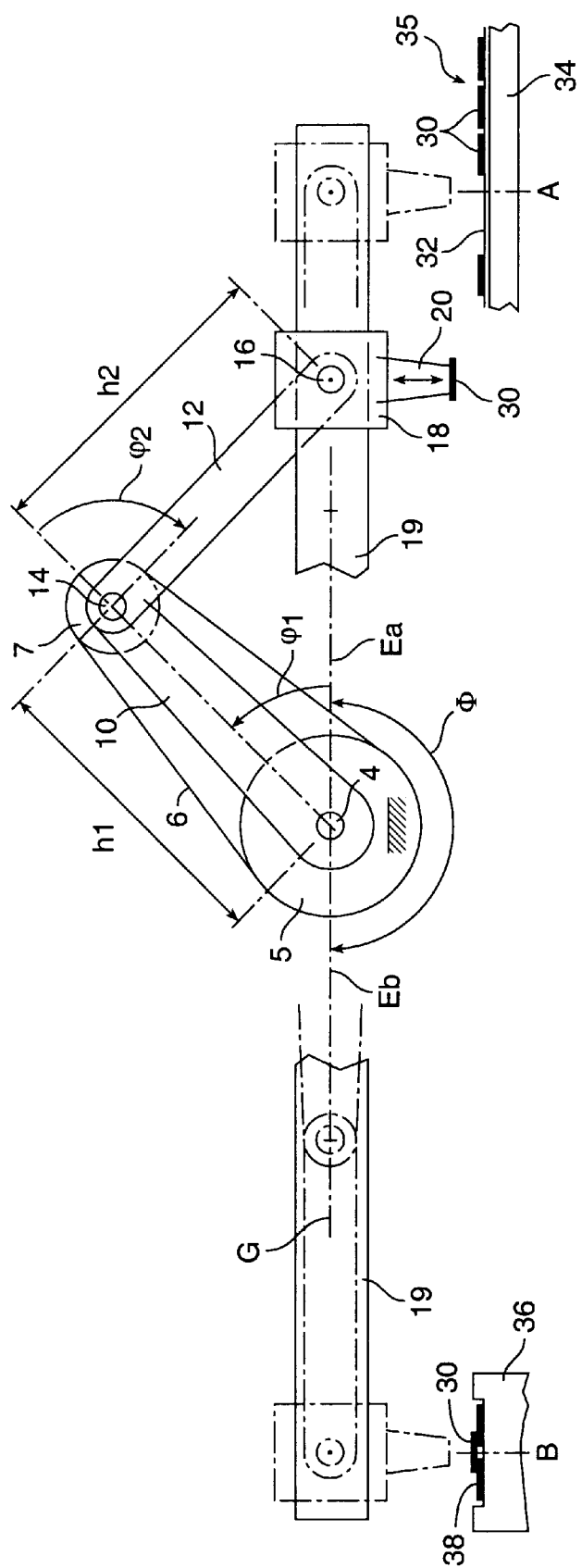

| | | | |
|---|---|---|---|
| 4,346,293 | 8/1982 | Fetzer | 250/222 R |
| 4,351,264 | 9/1982 | Flaum et al. | 118/203 |
| 4,378,134 | 3/1983 | Eddy | 308/3.5 |
| 4,383,359 | 5/1983 | Suzuki et al. | 29/712 |
| 4,584,047 | 4/1986 | Vanderpool et al. | 156/361 |
| 4,610,083 | 9/1986 | Campisi et al. | 29/832 |
| 4,615,093 | 10/1986 | Tews et al. | 29/407 |
| 4,819,326 * | 4/1989 | Stannek | 29/841 |
| 4,938,653 | 7/1990 | Wirz | 414/744.2 |
| 5,049,029 | 9/1991 | Mitsui et al. | 414/744.5 |
| 5,150,423 | 9/1992 | Hoki | 382/8 |
| 5,157,734 | 10/1992 | Chen et al. | 382/8 |
| 5,191,693 | 3/1993 | Umetsu | 29/429 |
| 5,195,234 | 3/1993 | Pine et al. | 29/720 |
| 5,213,653 | 5/1993 | Akahori et al. | 156/584 |
| 5,248,362 | 9/1993 | Sissons | 156/205 |
| 5,249,239 | 9/1993 | Kida | 382/8 |
| 5,275,657 | 1/1994 | Duffy et al. | 118/224 |
| 5,278,634 | 1/1994 | Skunes et al. | 356/400 |
| 5,289,625 | 3/1994 | Umetsu et al. | 29/426.3 |
| 5,309,223 | 5/1994 | Konicek et al. | 356/375 |
| 5,311,304 | 5/1994 | Monno | 348/87 |
| 5,342,460 | 8/1994 | Hidese | 156/64 |
| 5,380,099 | 1/1995 | Teramachi | 384/45 |
| 5,400,497 | 3/1995 | Watanabe et al. | 29/705 |
| 5,415,693 | 5/1995 | Yoneda et al. | 118/664 |
| 5,459,794 | 10/1995 | Ninomiya et al. | 382/145 |
| 5,475,919 | 12/1995 | Wu et al. | 29/841 |
| 5,488,771 | 2/1996 | Devitt et al. | 29/898.02 |
| 5,499,756 | 3/1996 | Banerji et al. | 228/214 |
| 5,515,600 | 5/1996 | Iwasaki et al. | 29/740 |
| 5,516,026 | 5/1996 | Ariye et al. | 228/6.2 |
| 5,547,537 | 8/1996 | Reynolds et al. | 156/351 |
| 5,559,727 | 9/1996 | Deley et al. | 364/559 |
| 5,564,188 | 10/1996 | Akasako et al. | 29/898.03 |
| 5,592,562 | 1/1997 | Rooks | 382/150 |
| 5,650,081 | 7/1997 | Hudson | 219/229 |
| 5,669,970 | 9/1997 | Balog et al. | 118/213 |
| 5,708,419 | 1/1998 | Isaacson et al. | 340/572 |
| 5,715,594 | 2/1998 | Patterson et al. | 29/842 |
| 5,735,040 | 4/1998 | Ochi et al. | 29/841 |
| 5,788,379 | 8/1998 | Reeve | 384/41 |
| 5,885,052 * | 3/1999 | Tsuji et al. | 414/744.6 |
| 6,077,022 | 6/2000 | Gfeller et al. | 414/416 |

FOREIGN PATENT DOCUMENTS

| | | | |
|---|---|---|---|
| 3-008655 | 1/1991 | (JP) | B65H/26/00 |
| 3-133763 | 6/1991 | (JP) | B65D/73/02 |
| 5-145283 | 6/1993 | (JP) | H05K/13/02 |
| 6-089910 | 3/1994 | (JP) | H01L/21/52 |
| 7-157259 | 6/1995 | (JP) | H01L/21/52 |
| 8-340175 | 12/1996 | (JP) | H05K/3/34 |
| 9-064094 | 3/1997 | (JP) | H01L/21/60 |

* cited by examiner

SEMICONDUCTOR MOUNTING APPARATUS WITH A CHIP GRIPPER TRAVELLING BACK AND FORTH

PRIORITY CLAIM

The present application claims priority under 35 U.S C. §119 based upon Swiss application no. 1997 2807/97, filed Dec. 7, 1997.

BACKGROUND OF THE INVENTION

1. Field of the Invention

The invention relates to a semiconductor mounting apparatus with a chip gripper which is moveable back and forth between a first location and a second location by means of a lever mechanism, in order to lift a chip from a chip carrier at the first location and to lay the chip on a substrate at the second location. Such an apparatus, described as a "pick and place" apparatus is used as a component of a mounting machine known as a "die bonder" in semiconductor mounting. It serves to mount the numerous similar chips of a wafer, which are located next to one another on a carrier, one after another on a substrate, for example, a metal lead frame. Coordinated with each pick and place movement, the wafer table on which the chip carrier is located makes available a next chip at said first location, and the substrate is also advanced in order to make available a new substrate location at the second location. For lifting up and subsequent laying down of the chips, the chip gripper can be raised and lowered in a known manner, either together with the whole apparatus or on its own relative to the apparatus. Extremely high demands are made on mounting apparatus of this type. For the further processing of the mounted chips (contacting of the integrated circuit in the wire bonder), the chips must be accurately positioned on the substrate, which requires a correspondingly accurate arrival at the second location by means of the chip gripper, and also necessitates the previous precise transporting to the first location for lifting up the chip. On the other hand, high speeds and short cycle times of the movement sequences are required, which cause correspondingly high accelerations and inertial forces to occur on the parts moved.

2. The Background Art

Up until now different lever mechanisms have been used to produce the alternating movements of the chip gripper, which sometimes include guide slots (for example, in the manner of the known maltese transmission arrangement). Such slots are disadvantageous for achieving precise movement because of the considerable shearing forces occurring with them, and have to be serviced accordingly. With another known mechanism, the chip gripper is seated at the end of a lever pivoting back and forth, that is to say it performs a curve-shaped movement corresponding to the swinging displacements of the lever, which must always be stopped in the end positions, wherein there is a strong tendency for vibration. With the known arrangements it is therefore difficult to satisfy the demands existing in practice with respect to accuracy as well as to speed.

The object of the invention is to overcome the existing disadvantages of the prior art with a semi-conductor mounting apparatus of the type described in the introduction. The pick and place mechanism must, above all, ensure accurate positioning of the chip gripper in both end positions, but along with this also make possible rapid back and forth movements, that is to say short cycle times.

BRIEF DESCRIPTION OF THE INVENTION

This object is solved in accordance with the invention with the characterising features of claim 1. According to this, the lever mechanism of the apparatus is provided with a first pivoted lever which is seated on a shaft mounted equidistantly between the first and second locations and is driven in alternating pivoting directions between two end positions, in which it is directed towards one or the other end position. A second pivoted lever is mounted on the end of the first pivoted lever. It is driven the opposite way around with respect to the direction of pivoting of the first pivoted lever, and with a certain gear ratio with respect to the pivoting movement thereof; at its end it is connected to the chip gripper. Said gear ratio, as well as the lengths of the two pivoted levers are matched to each other in a particular manner, that is to say that in the two end positions of the first pivoted lever, the two pivoted levers are in an extended position with respect to one another and the chip gripper has arrived over one or the other location.

Such matching is produced when, respectively:

$$n=360°/\Phi;\ h1/h2=n-1;\ h1+h2=S,$$

wherein:

n=gear ratio
$\Phi$=pivoting range of the first pivoted lever between the end positions
h1=length of the first pivoted lever
h2=length of the second pivoted lever
S=distance between the pivoting axis of the first pivoted lever and the first or the second location As can be seen (also with reference to specific examples described later on), different embodiments with different, matched pivoting ranges, gear ratios and lever proportions are possible. With respect to the object of the invention, with this type of lever mechanism, of primary importance is the condition that at the end of each movement cycle the chip gripper always reaches its end position (that is to say the first or the second location) in the direction of the extended pivoted lever, that is to say the movement components at right-angles to the longitudinal direction of the levers disappear in the end positions. The inertial force of the accelerated chip gripper then acts in the direction of the extended levers and contributes in a certain way to the stabilising of the extended position. Lastly, an occasional over-swing of the first pivoted lever in the extended positions (which must be stopped at the end of its pivoting range) is of diminishing influence on the end positions of the chip gripper. Such advantageous kinematic and dynamic properties of the lever mechanism endow the mounting apparatus according to the invention with high and long-term stable positioning accuracy and at the same time allow short cycle times.

A particularly simple and advantageous embodiment of the invention is produced where the pivoting range $\Phi=180°$, the gear ratio n=2, and the lever proportions h1/h2=1. A lever mechanism with these parameters is known per se as a so-called straight-line mechanism, which means that a body moved by it—in this case the chip gripper—moves in a straight line.

As described hereinabove, the apparatus according to the invention can, in principle, also be produced using other parameters (even with values of n which are not integer numbers). Particular further configurations of the apparatus according to the invention defined in claim 1 are described in the dependent claims.

BRIEF DESCRIPTION OF THE DRAWING FIGURES

Figure 2:
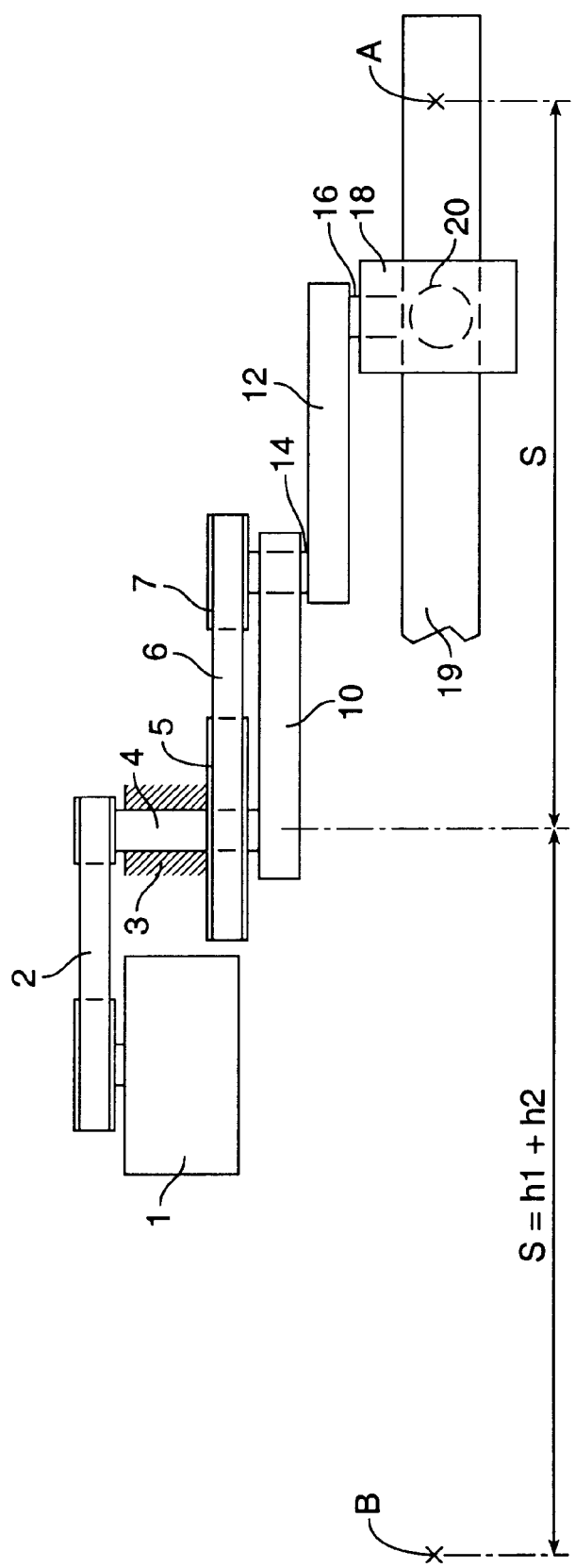
Figure 3:
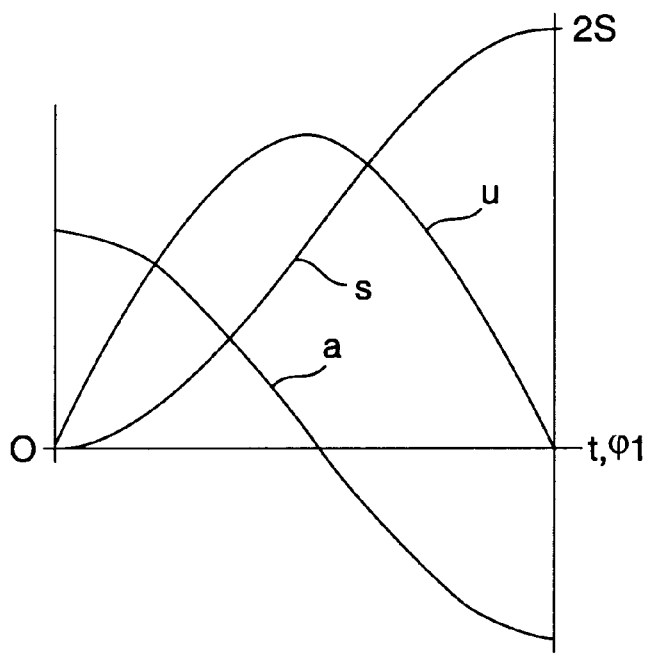
Figure 4:
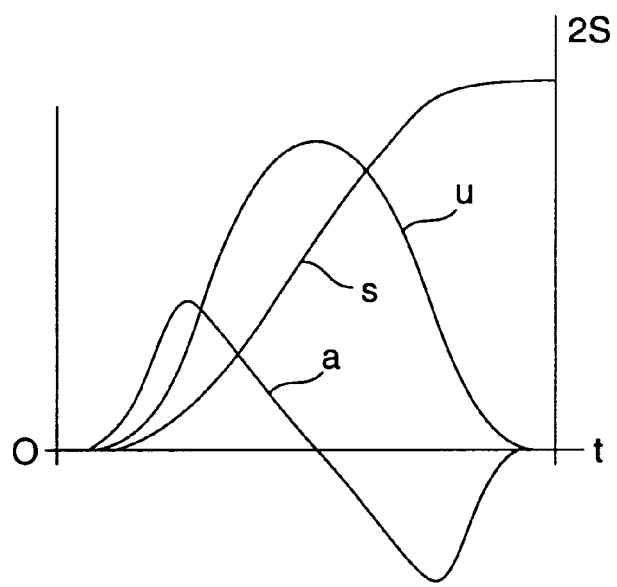
Figure 5:
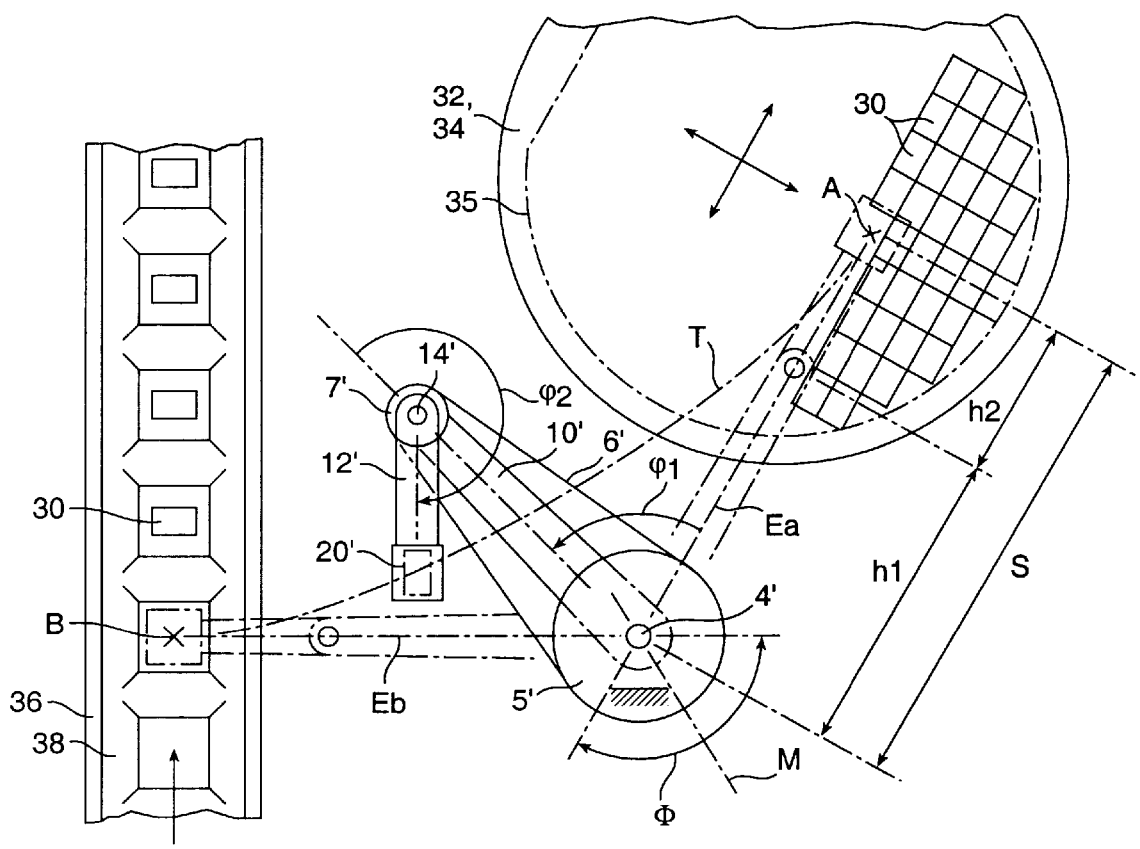
Figure 6:
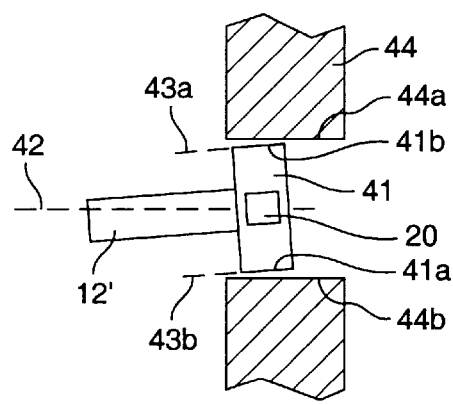

FIG. 1 is a simplified diagram of the view from the side of a first embodiment of the semiconductor mounting apparatus according to the invention, FIG. 2 is the plan view of the apparatus according to FIG. 1 (wafer and substrate omitted), FIGS. 3 and 4 are timing diagrams of the apparatus according to FIGS. 1 and 2, FIG. 5 shows a plan view of a further embodiment; and FIG. 6 shows delimiter means.

DETAILED DESCRIPTION OF THE INVENTION

The semiconductor mounting apparatus according to FIGS. 1 and 2 is a component of a mounting machine called a "die bonder", not shown in more detail and known to those of ordinary skill in the art. Its purpose is, by means of a chip gripper 20, repetitively to lift a semiconductor chip 30 from a chip carrier 32 at a first location A and, after displacing the chip gripper, to lay the chip on a substrate 38 at a second location B ("pick and place"). The chip carrier 32 (typically an adhesive foil) with the chips of a wafer 35, is located on a displaceable wafer table 34 which makes available a next chip 30 at location A. The substrate 38, for example, a metallic lead frame, lies on a displacement means 36 described as an "indexer", which advances the substrate in a step-wise manner in order to make available a free substrate location for receiving the subsequent chip at location B. The wafer table and indexer are components known to those of ordinary skill in the art and, as they are not the subject-matter of the invention, are not shown in more detail (and are completely omitted in FIG. 2). For the lifting and subsequent laying down of the chip 30, the chip gripper 20 (a component of a so-called bonding head) can be moveable up and down relative to the pick and place apparatus, as shown schematically in FIG. 1 by means of arrows, but the apparatus can also be configured to be moveable vertically as a whole (seen in FIG. 1).

The pick and place apparatus according to FIGS. 1 and 2 comprises a first pivoted lever 10 which sits on a shaft 4. The shaft 4 is hold centrally between locations A and B (bearing 3, FIG. 2), that is to say, the pivoting axis of the lever 10 is at the same distance S from A and from B. A second pivoted lever 12 is mounted by means of a shaft 14 at the end of the first pivoted lever. The end of the second lever is in turn connected by means of an axle 16 to a slide 18. This carries the chip gripper 20 and slides along a linear guide 19 which extends between A and B.

A stationary rotary actuator, for example, composed of a motor 1 and toothed belt mechanism 2 (shown only in FIG. 2) drives the first lever 10 by means of the shaft 4 with an alternating direction of pivoting. The lever 10 thus sweeps a pivoting range Φ between two end positions Ea, Eb, in each of which respectively it faces towards on the one hand location A and on the other hand, location B. In FIG. 1 the end positions of the pivoted lever and of the chip gripper are shown in dashed lines, and an intermediate position (with the pivoting angle φ1 of the lever 10) is shown, on the other hand, in solid lines. The end positions Ea and Eb of the first angled lever 10 are determined and maintained by appropriate drive control of the motor 1.

The second pivoted lever 12 is not carried along "passively" by the first lever 10, but instead is subject to being driven with a predetermined gear ratio relative to the first lever 10 and in the opposite direction to the direction of pivoting of the first lever 10. In accordance with the example shown, this drive is produced by means of a toothed belt 6 which loops around a fixed toothed wheel 5 coaxial to the shaft 4 and a toothed wheel 7 fitted onto the shaft 14 (instead of the toothed belt 6, an intermediate toothed wheel mounted on the lever 12, which meshes with the toothed wheels 5 and 7, could be provided). In this way the pivoting movements of the two levers 10 and 12 (pivoting angles φ1 and φ2) are coupled together in a particular way.

In the case of the given pivoting range Φ of 180°, the gear ratio n between the levers 10 and 12 equals 2, that is to say, in each position of the levers, the angle φ2 of the lever 12 relative to the lever 10 is always twice the angle of pivoting φ1 of the lever 10. It is also important that the levers 10 and 12 have the same length h1 and h2 and the sum of the two lever lengths h1+h2 equals the distance S. In this way the gear ratio n and the lever lengths h1, h2, corresponding to the proportions described hereinabove, are matched to the pivoting range Φ=180°. As a result of this, in each end position Ea and Eb of the first pivoted lever 10, the two pivoted levers 10 and 12 are in an extended position with respect to one another, and the chip gripper 20 is located over either location A or the other location B.

The lever mechanism according to FIGS. 1 and 2 has the properties of a straight-line mechanism, that is to say the end of the second pivoted lever 12 (axle 16) moves in a straight line G. This means that no shearing forces or moments are exerted by the slide 18 on the linear guide 19. This guide and the articulated connection between the slide 18 and the lever 12 essentially have only the function of maintaining the orientation of the chip gripper during its displacement (when there is a rigid connection between the lever 12 and the chip gripper 20 the latter is turned together with the transported chip 30 respectively by 180°—with respect to the planes of the chip carrier 32 and the substrate 38). As can easily be seen from FIG. 1, the chip gripper arrives with a high degree of accuracy over locations A or B by virtue of the extended positions of the two pivoted levers, in that their longitudinal axes, that is to say the axes 4, 14 and 16 lie on the straight line G. In these extended positions the arrangement has a high degree of rigidity. In this way, essential conditions for precise lifting of the chip 30 from the chip carrier and the accurate mounting thereof on the substrate are satisfied.

FIG. 3 shows the characteristic over time of the path s, the speed v and the acceleration a at the end of the second pivoted lever (axle 16) during a cycle of movement from A to B, or vice-versa, with the idealised assumption that the pivot angle φ1 varies linearly with time t. As can be seen, with the lever mechanism according to FIGS. 1 and 2, all three values s, v and a vary according to harmonic functions. With the alternating movement, however, sudden starting and stopping of the drive, as assumed in FIG. 3 is not realistic. The diagram according to FIG. 4 shows a corresponding characteristic of s, v and a in practical conditions with "gentle" initiation and braking of the drive in the area of the end positions. In the embodiment according to FIGS. 1 and 2, the pivoting movements of the levers 10 and 12 take place in vertical planes, that is to say perpendicular to the chip carrier 32 and to the substrate 38. Other embodiments are thus also conceivable, in which the pivoting axles of the levers are perpendicular and the levers move in corresponding horizontal planes which lie parallel to the planes of the chip carrier and the substrate. The chip gripper can then be rigidly connected to the end of the second pivoted lever, and a longitudinal guide (corresponding to the linear guide 19 in FIGS. 1 and 2) is then in principle not required. Concerning the orientation of the chip carrier on the wafer table it must, however, be taken into account that the chips are rotated by 180° in their planes along the path from A to B. With such variations of embodiments, it can also be advantageous to provide end stops for the vertical and lateral position of the chip gripper (and of the second pivot lever).

In FIG. 5 there is shown in plan view a further example of a semi-conductor mounting apparatus according to the invention, with pivoted levers 10' and 12' arranged to be horizontally pivotable, and parameters changed compared to the example according to FIGS. 1 and 2. With this configuration, the range of pivoting Φ' is 120°, correspondingly the gear ratio n=3, and the ratio of the lever lengths h1/h2=2; the sum of h1+h2 of the levers of different lengths is again equal to the distance S between the axle 4' of the first pivoted lever 10' and the location A or the location B.

The axle 4' of the first pivoted lever 10' is mounted on the central perpendicular M between A and B such that in the end positions Ea and Eb the lever 10', and the second pivoted lever 12' in the extended position with respect to it, face the location A or B. The chip gripper 20', here rigidly connected to the end of the second lever 12', is then located over the location A or B. The alternating pivoting drive (not shown) of the lever 10' can then be configured in an analogous manner to that according to FIG. 2, wherein, however, the pivoting range is, as described, only 120°. The end positions Ea and Eb are again determined by appropriate controlling of the drive motor. A toothed belt 6' which loops around the stationary toothed wheel 5' and the toothed wheel 7' again serves for coupled drive in the opposite direction of the second pivoted lever 12'. Said toothed wheel 7' is connected via the shaft 14' to the lever 12', and its number of teeth is ⅓ that of the wheel 5'. Therefore, the angle of pivoting φ2 of the lever 12' relative to the lever 10' is always three times the angle of pivoting φ1 of the lever 10'.

Each chip 30 undergoes a rotation of 120° along the path from A to B. The wafer 35 must therefore correspondingly be orientated with the edges of the chip parallel and perpendicular to Ea, and also the displacements of the wafer table 34 must naturally be orientated as shown by the arrows in FIG. 5. The parameters described hereinabove thus also satisfy the extended position criteria for the two pivoted levers in the end positions Ea and Eb with this variant. In this case the chip gripper 20' does not move in a straight line between A and B, but instead in a curved path T. The end positions Ea and Eb in A and B are tangential to this path T, which means that in this case too, when the chip gripper arrives at A or B, the movement components at right-angles to Ea and Eb disappear. The arrangement described hereinabove thus has similar advantageous properties to the example previously described.

The construction of the pick and place apparatus with the two pivot levers 10' and 12' further allows the use of delimiters which guide the movement of the chip gripper 20 in the end positions Ea and Eb and thus efficiently prevent the swinging of the pivot lever 12' and the chip gripper 20 at their quick stops. FIG. 6 shows the pivot lever 12' in a position shortly before it reaches its end position Eb. The pivot lever 12' has a T-shaped end 41 with two end faces 41a and 41b. The center of the chip gripper 20 moves along the dashed line 42. The end faces 41a and 41b move along the curves 43a and 43b, respectively. The pick and place apparatus has delimiter means 44 arranged laterally to the direction of movement of the chip gripper 20. The faces 44a and 44b of the delimiter means 44 are adapted to the curves 43a and 43b, respectively, so that the faces 41a and 41b of the pivot lever 12' slide along the faces 44a and 44b of the delimiter means 44.

In the embodiment according to FIGS. 1 and 2 delimiter means could replace the linear guide 19.

The advantages of a pick and place apparatus with two pivot levers versus a pick and place apparatus with a single pivot lever are in particular that the stopping of the chip gripper 20 in the end positions Ea or Eb can be improved by the use of delimiter means and that during the pivoting movement smaller centrifugal forces show up because of the shorter lengths of the lever arms which also results in reduced power consumption of the drive.

What is claimed is:

1. An apparatus used as a component of a die bonder for placing a semiconductor chip on a substrate, comprising:

a first pivoted lever seated at one end on a first shaft, said first shaft mounted equidistantly between a first location and a second location, said first pivoted lever having a second shaft seated at another end;

a drive coupled to said first shaft for pivoting said first pivoted lever in alternating pivoting directions through an angle of pivoting between a first end position in which said first pivoted lever is directed toward said first location and a second end position in which said first pivoted lever is directed toward said second location;

a second pivoted lever having a same length as said first pivoted lever, a sum of lengths of said first and second levers equaling a distance from said first shaft to said first location or said second location, said second pivoted lever seated at one end on said second shaft, said second pivoted lever further having an axle seated at another end;

a drive mechanism coupled to said second pivoted lever for rotating said second pivoted lever in an opposite pivoting direction with respect to said first pivoted lever;

a slide seated on said axle which glides linearly between said first and second locations along a linear guide member; and a semiconductor chip gripper coupled to said slide which glides linearly between said first and second locations in correspondence with said slide.

2. The apparatus according to claim 1, wherein said angle of pivoting of said first pivoted lever between said first end position and said second end position equals 180°.

3. The apparatus according to claim 2, wherein said drive mechanism comprises:

a first fixed toothed wheel coaxial to said first shaft;

a second toothed wheel fixed and coaxial to said second shaft; and a toothed belt looped around and engaging said first and second toothed wheels.

4. The apparatus according to claim 3, wherein said toothed belt is an intermediate wheel.

5. The apparatus according to claim 3 wherein a gear ratio of said first tooth wheel and said second toothed wheel equals two.

6. The apparatus according to claim 4 wherein a gear ratio of said first tooth wheel and said second toothed wheel equals two.

7. The apparatus according to claim 1, wherein said first and second pivoted levers pivot in a plane which is perpendicular to said substrate.

8. The apparatus according to claim 7, wherein said drive mechanism comprises:

a first fixed toothed wheel coaxial to said first shaft;

a second toothed wheel fixed and coaxial to said second shaft; and a toothed belt looped around and engaging said first and second toothed wheels.

9. The apparatus according to claim 8 wherein a gear ratio of said first tooth wheel and said second toothed wheel equals two.

10. The apparatus according to claim 8, wherein said toothed belt is an intermediate wheel.

11. The apparatus according to claim 10 wherein a gear ratio of said first tooth wheel and said second toothed wheel equals two.

12. The apparatus according to claim 2, wherein said first and second pivoted levers pivot in a plane which is perpendicular to said substrate.

13. The apparatus according to claim 12, wherein said drive mechanism comprises:
    a first fixed toothed wheel coaxial to said first shaft;
    a second toothed wheel fixed and coaxial to said second shaft; and
    a toothed belt looped around and engaging said first and second toothed wheels.

14. The apparatus according to claim 13 wherein a gear ratio of said first tooth wheel and said second toothed wheel equals two.

15. The apparatus according to claim 13, wherein said toothed belt is an intermediate wheel.

16. The apparatus according to claim 15 wherein a gear ratio of said first tooth wheel and said second toothed wheel equals two.

17. The apparatus according to claim 1, wherein said drive mechanism comprises:
    a first fixed toothed wheel coaxial to said first shaft;
    a second toothed wheel fixed and coaxial to said second shaft; and
    a toothed belt looped around and engaging said first and second toothed wheels.

18. The apparatus according to claim 17, wherein said toothed belt is an intermediate wheel.

19. The apparatus according to claim 18 wherein a gear ratio of said first tooth wheel and said second toothed wheel equals two.

20. The apparatus according to claim 17 wherein a gear ratio of said first tooth wheel and said second toothed wheel equals two.

21. The apparatus according to claim 1, wherein said first and second pivoted levers pivot in planes which lie parallel to the substrate.

22. The apparatus according to claim 21, characterised in that a pivoting range between the first and second end positions of the first pivoted lever equals 120°, a gear ratio between said first and second pivoted levers equals 3, and a ratio of lenghts of the first and second pivoted levers and equals 2.

23. The apparatus according to claim 22, wherein the second pivoted lever is seated on a shaft upon which a toothed wheel is seated, which is, in turn, driven by a toothed wheel fixed on and coaxial to the drive shaft via a toothed belt or an intermediate wheel mounted on the first pivoted lever.

24. The apparatus according to claim 21, wherein the chip gripper is rigidly connected to an end of the second pivoted lever.

25. The apparatus according to claim 21, wherein the first and second end positions, delimiter means for the second pivoted lever are arranged laterally to a direction of movement of the chip gripper.

26. The apparatus according to claim 24, wherein the second pivoted lever is seated on a shaft upon which a toothed wheel is seated, which is, in turn, driven by a toothed wheel fixed on and coaxial to the drive shaft via a toothed belt or an intermediate wheel mounted on the first pivoted lever.

27. The apparatus according to claim 25, wherein the second pivoted lever is seated on a shaft upon which a toothed wheel is seated, which is, in turn, driven by a toothed wheel fixed on and coaxial to the drive shaft via a toothed belt or an intermediate wheel mounted on the first pivoted lever.

28. The apparatus according to claim 21, wherein the second pivoted lever is seated on a shaft upon which a toothed wheel is seated, which is, in turn, driven by a toothed wheel fixed on and coaxial to the drive shaft via a toothed belt or an intermediate wheel mounted on the first pivoted lever.

* * * * *

UNITED STATES PATENT AND TRADEMARK OFFICE
CERTIFICATE OF CORRECTION

PATENT NO. : 6,185,815 B1
DATED : February 13, 2001
INVENTOR(S) : Samuel Schindler It is certified that error appears in the above-identified patent and that said Letters Patent is hereby corrected as shown below:

Column 4,
Line 51, beginning with "In the embodiment" there should be a new paragraph.

Column 8,
Lines 4 and 5, replace "characterised in that" with -- wherein --.
Line 8, after "levers" delete "and".

Signed and Sealed this

Twenty-fourth Day of December, 2002

JAMES E. ROGAN
*Director of the United States Patent and Trademark Office*